United States Patent
Soga et al.

(10) Patent No.: US 6,563,225 B2
(45) Date of Patent: May 13, 2003

(54) PRODUCT USING ZN-AL ALLOY SOLDER

(75) Inventors: Tasao Soga, Fujisawa (JP); Toshiharu Ishida, Fujisawa (JP); Kazuma Miura, Yokohama (JP); Hanae Hata, Yokohama (JP); Masahide Okamoto, Yokohama (JP); Tetsuya Nakatsuka, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/083,543

(22) Filed: Feb. 27, 2002

(65) Prior Publication Data

US 2002/0149114 A1 Oct. 17, 2002

(30) Foreign Application Priority Data

Apr. 11, 2001 (JP) ......................................... 2001-112157

(51) Int. Cl.[7] ................................................ H01L 23/48
(52) U.S. Cl. ...................... 257/782; 257/783; 257/771; 257/772; 438/118; 438/612
(58) Field of Search ................................ 257/772, 771, 257/782, 783, 779, 747, 746; 438/118, 612

(56) References Cited

U.S. PATENT DOCUMENTS

| 4,659,399 A | 4/1987 | Barajas |
| 4,731,130 A | 3/1988 | O'Leary |
| 5,293,066 A | 3/1994 | Tsumura |
| 2002/0171157 A1 * | 11/2002 | Soga et al. ................. 257/783 |

FOREIGN PATENT DOCUMENTS

| FR | 2706139 | 12/1994 | |
| JP | 53124150 A | * 10/1978 | ........... B23K/35/28 |
| WO | WO 02/49797 | 6/2002 | |

OTHER PUBLICATIONS

European Search Report dated Jul. 30, 2002.

Patent Abstracts of Japan, vol. 2000, No. 10, Nov. 17, 2000 & JP 2000 208533 A (Sumitomo Metal Mining Co Ltd), Jul. 28, 2000.

* cited by examiner

*Primary Examiner*—Nathan J. Flynn
*Assistant Examiner*—Pershelle Greene
(74) *Attorney, Agent, or Firm*—Antonelli, Terry, Stout & Kraus, LLP

(57) ABSTRACT

There is provided an electronic device comprising at least one electronic part and a substrate on which said electronic part is mounted, said electronic part and said substrate being bonded by a joint comprising a phase of Al particles and another phase of a Al—Mg—Ge—Zn alloy, said Al particles being connected to each other by said Al—Mg—Ge—Zn alloy phase.

17 Claims, 7 Drawing Sheets

PRODUCT USING ZN-AL ALLOY SOLDER

BACKGROUND OF THE INVENTION

Conventionally, Sn—Pb alloy solders have made it possible to perform temperature-hierarchical bonding in which first soldering is performed at a temperature of about 330° C. by use of a high-temperature solder such as Pb-rich Pb-5 mass % Sn (hereinafter the indication of "mass %" is omitted and only numerals are recited) solders (melting point: 314–310° C.) or Pb-10Sn solders (melting point: 302–275° C.) and in which second bonding is then performed by use of a low-melting point solder of Sn-37Pb eutectic (melting point: 183° C.) without melting the first soldered portions. These solders are soft and rich in deformability and, therefore, they can be used for bonding Si chips etc. apt to be broken to a substrate having a different thermal expansion coefficient and also for structural purposes. This temperature-hierarchical bonding is mainly adopted in semiconductor devices in which chips are die-bonded and in semiconductor devices in which chips are flip-chip-bonded such as BGA and CSP etc. In other words, this means that a solder used within a semiconductor device and another solder for bonding the semiconductor device itself to a substrate are used for the temperature-hierarchical bonding. On the other hand, the temperature-hierarchical bonding is used also for bonding power modules etc. used at high temperatures.

SUMMARY OF THE INVENTION

The present invention relates to a Zn—Al alloy solder and a product in which this solder is used. More particularly, the invention relates to a Pb-free solder which makes it possible to perform temperature-hierarchical bonding on the high-temperature side relative to, for example, an Sn—Ag—Cu alloy Pb-free solder and which is a thermal-fatigue-resistant solder excellent in rolling workability, and a product in which the solder is used, such as, for example, a semiconductor device and a semiconductor module.

At present, Pb-free design is prevailing in all fields.

As Pb-free solders, Sn—Ag eutectic solders (melting point: 221° C.), Sn—Ag—Cu eutectic solders (melting point: 221–217° C.) and Sn—Cu eutectic solders (melting point: 227° C.) come to be used. Although it is desirable that soldering temperatures in surface mounting be low in view of the heat resistance of parts, it is necessary to ensure wettability in order to keep the reliability and, for this reason, actual soldering temperatures in the case of the Sn—Ag—Cu eutectic solders capable of bonding at the lowest temperatures among Pb-free solders are about 235 to 250° C. maximum in consideration of temperature variations within a substrate even if a furnace excellent in controlling for even temperature distribution is used. Therefore, solders capable of withstanding this soldering temperature range are required to have a melting point not less than 260° C. At present, there is no soft Pb-free solder for a temperature hierarchical bonding on the high-temperature side which solder can be used in combination with these solders of the low temperature side. As a composition which seems most appropriate for the high temperature side, there is a Sn-5Sb alloy solder (melting point: 240–232° C.). However, because the solder melts at the high temperature range, they cannot be used in the temperature-hierarchical bonding.

Further, although an Au-20Sn solder (melting point: 280° C.) is known as a high-temperature solder, its use is limited to a narrow range because it is a hard material and its cost is high. Especially, in bonding an Si chip to a material having a different coefficient of thermal expansion or in bonding a large-size Si chip, this Au-20Sn solder is not used because there occurs such a fear as the Si chips are broken due to the high hardness of this solder.

In the invention, there are proposed a material, a system and a structure which are suitable for large-area bonding, for example, Si die-bonding and power module bonding. In the large-area bonding are required soft solder joints which have a thermal fatigue-resisting property and which are free from voids. In addition, it is also required that flux-less bonding be possible when forming these joints.

The object of the invention is to provide a new solder by improving and modifying Zn—Al alloy solders which new solder is used as the solder of the high-temperature side. This solder is intended to be used not only in the field of electronic devices, but also in the general structural field.

Representative features of the invention for achieving the object are recited below.

According to the first aspect of the invention, there is provided an electronic device comprising at least one electronic part and a substrate on which the electronic part is mounted, the electronic part and the substrate being bonded to each other by joints comprising Al particles and an Al—Mg—Ge—Zn alloy, and the Al particles being connected to each other by the Al—Mg—Ge—Zn alloy.

According to the second aspect of the invention, there is provided a semiconductor device in which each of pads of the semiconductor chip and each of leads of a substrate on which the semiconductor chip is mounted are electrically connected by a gold wire, the semiconductor chip and the substrate being bonded by solder joints each comprising Al particles and an Al—Mg—Ge—Zn alloy.

According to the third aspect of the invention, there is provided a semiconductor device in which each of pads of the semiconductor chip and each of leads of a substrate on which the semiconductor chip is mounted are electrically connected by a gold wire, the semiconductor chip and the substrate being bonded by solder joints each comprising Cu particles and an Al—Mg—Ge—Zn alloy.

In the semiconductor device, the surfaces of the Al particles may be plated with at least one kind selected from the group consisting of Ni, Cu, Ag, Sn and Au.

Also, in the semiconductor device, the surfaces of the Cu particles may plated with at least one kind selected from the group consisting of Ni, Cu, Ag, Sn and Au.

In the semiconductor device, each of the solder joints may include plastic particles.

In the semiconductor device, the material for the plastic particles may be made of at least one resin selected from the group consisting of polyimide, heat-resistant epoxy, silicone, various types of polymer beads, modified types of these materials and a mixture of these.

Further, in the semiconductor device, each of the solder joints may have Sn and/or In particles in addition to the Al particles. This results in a reduction in the coefficient of thermal expansion of a solder.

Further, in the semiconductor device, each of the solder joints may have Sn and/or In particles in addition to the Cu particles. This results in a reduction in the coefficient of thermal expansion of a solder.

In the semiconductor device, each of the solder joints may include particles of at least one kind selected from the group consisting of invar, silica, alumina, AlN and SiC in addition to the Al particles. AlN is aluminum nitride which is known as a high-thermal conductivity ceramic. SiC is silicon carbide which is known similarly as a high-thermal conductivity ceramic.

Also, in the semiconductor device, each of the solder joints may include particles of at least one kind selected from the group consisting of invar, silica, alumina, AlN and SiC in addition to the Cu particles. This results in a reduction in the coefficient of thermal expansion of the solder.

In the semiconductor device, the Al—Mg—Ge—Zn alloy may consist, by mass, of 3 to 7% Al, 0.5 to 6% Mg, 1 to 5% Ge, and the balance Zn and incidental impurities.

In the semiconductor device, the Al—Mg—Ge—Zn alloy may include a 4Al-3Mg-4Ge—Zn alloy.

According to the fourth aspect of the invention, there is provided an electronic device such as, for example, a semiconductor module or a multi-chip module, in which the semiconductor device is mounted on another circuit board by use of a Pb-free solder (, that is, a solder which does not positively contain any lead) such as an Sn—Ag—Cu alloy solder and etc. In this case, temperature-hierarchical (, that is, high-temperature and low-temperature) bonding can be realized for the Pb-free solder bonding of the semiconductor device (package) and for the mounting of the semiconductor device on another substrate.

According to the fifth aspect of the invention, there is provided a method of producing a semiconductor device, comprising the steps of: dicing a semiconductor wafer; mounting on a lead frame a chip cut from the semiconductor wafer (die-bonding); wire-bonding the semiconductor chip and the lead frame together by means of a gold wire etc.; resin-molding the semiconductor chip; and cutting the lead frame, wherein the semiconductor chip is mounted on the lead frame by use of a solder comprising Al particles and an Al—Mg—Ge—Zn alloy, and the Al particles are connected to each other by the Al—Mg—Ge—Zn alloy.

According to the sixth aspect of the invention, there is provided a method of producing a semiconductor device, comprising the steps of: dicing a semiconductor wafer; mounting on a lead frame a chip cut from the semiconductor wafer (die-bonding); wire-bonding the semiconductor chip and the lead frame together by means of a gold wire etc.; resin-molding the semiconductor chip; and cutting the lead frame, wherein the semiconductor chip is mounted on the lead frame by use of a solder comprising Cu particles or Cu particles subjected to a surface treatment such as Ni/Au plating and an Al—Mg—Ge—Zn alloy, and the Cu particles or surface-treated Cu particles are connected to each other by the Al—Mg—Ge—Zn alloy.

In the die bonding step of the semiconductor device manufacturing method, the die-bonding may be performed while jetting a nitrogen gas.

Also, the die-bonding step of the semiconductor device manufacturing method may be performed in an inactive atmosphere of a nitrogen gas etc. or in a reducing atmosphere of a hydrogen gas etc. or in a mixed atmosphere of both of them.

According to the seventh aspect of the invention, there is provided a semiconductor module or multi-chip module manufacturing method having the steps of mounting the semiconductor device on another substrate by use of a Pb-free solder such as an Sn—Ag—Cu alloy solder.

In the temperature-hierarchical bonding, it is thought that, in a case where, even if a part of the high-temperature side solder having been already bonded is re-melted, most of the high temperature side solder do not remelt, the high-temperature side solder can, in most cases, withstand the process during the solder bonding for the post-bonding operation. That is, it is necessary that the high-temperature side solder which has already been bonded have a bonding strength capable of withstanding the reflow condition of 260° C. Accordingly, the present inventors have remarked Zn—Al alloy solders of a low cost as predominant high-temperature solders and have researched them for improving and reforming these solders. Some high-temperature solders used in power modules must have a melting point not less than 250° C. and are, at the same time, required to meet such a severe condition as even a part of a solder must not melt, insofar as severe, some product fields are concerned. For this reason, the inventors have produced solders which do not melt even at temperatures not less than 260° C. and other solder which have a strength even at 260° C. even when they partly melt at this temperature.

Because the Zn—Al alloy solders have many shortcomings, it is necessary to remove the shortcomings. A Zn-5Al eutectic solder has a high melting point of 382° C. and hence it is especially difficult to perform soldering at a relatively low temperature of about 300° C. In this case, it is necessary for the solder to have a composition which maintains a strength at a temperature not less than 260° C. even when a part of the solder melts. Main requirements and problems are explained below and means for the solution thereof are described.

First, (1) the melting points of Zn—Al alloy solders must be lowered to a level of 300° C. Next, (2) in a case where the Zn—Al alloy solders are used in a foil form, the Zn—Al alloy solders must be rolling-workable. Furthermore, in view of the respect that the bonding of different kinds of materials is often performed, the following requisites are needed for a temperature cycle test etc.: (3) solder joints must have thermal fatigue-resisting properties; (4) the solder itself must have a flexibility; (5) in the state of a foil, the Zn—Al alloy solders must be free from voids; (6) it is possible to prevent the solders from being oxidized (soldering in a $N_2$ gas); and (7) the Zn—Al alloy solders must be excellent in corrosion resistance. Solders that can meet these requisites are suitable for the temperature-hierarchical bonding. Incidentally, it is not always necessary to meet all of these requisites.

To meet the requirements (1) and (2), the inventors has researched a Zn—Al alloy solder composition which has a melting point at a lowered level of 300° C. and which is excellent in rolling-workability. Although a Zn-5AL solder is a eutectic solder having a melting point of 382° C., its melting point is too high and the solder poses the problem of oxidation. By adding both Mg and Ge to a Zn—Al alloy solder, the melting point can be lowered by a certain level and, at the same time, it is possible to ensure the rolling-workability and to improve the oxidation resistance. Mg is effective in preventing the grain-boundary corrosion and lowers the melting point, however, the Mg adding of an excessive amount makes the material brittle. The rolling working of a Zn-5Al—Mg alloy is impossible. However, the present inventors have found that the rolling working becomes possible when Ge is added to the Zn-5Al—Mg alloy. Namely, Ge is an element necessary for the rolling working. Although the workability of the Zn-5Al—Ge alloy itself is good, there are such problems as the melting point is too high and as the grain-boundary corrosion occurs. Accordingly, it is important to add both Mg and Ge in the Zn—Al alloy.

Further, when Sn, In and Ga are added in the Zn—Al alloy, the soldering temperature is decreased although the liquidus line temperature thereof does not decrease so much, with the result that the soldering at about 330° C. becomes possible. The solderability thereof is improved by adding much amounts of Sn and In. However, in a case where a much amount of Sn is added, the melting of an Sn—Zn phase (having a solidus line temperature of about 197° C.) occurs. Also in the case of the addition of In, the melting of an In—Zn phase (having a solidus line temperature of about 144° C.) occurs. However, even in the case where the partial melting occurs, no problem occurs in many cases because the strength can be maintained at the high temperature by the most of the solder other than the melted portions. Therefore, by dispersing the relatively soft phases each having the low melting point, the bonding can be performed at a temperature very close to 300° C. and it become possible to keep a strength at the high temperature (, that is, in the case of an Sn-3Ag-0.5Cu alloy solder, the usual reflow temperature thereof becomes 250° C. at maximum).

Next, the improvement in the thermal fatigue property (Paragraph 3) and the flexibility of the solder itself (Paragraph 4) can often be simultaneously achieved. That is, the Zn—Al—Mg—Ge alloy itself is hard in hardness and is poor in deformability although the solder has a high strength, a large rigidity and a good workability. Thus, in the case of using this solder for a large Si chip etc., there occurs such a fear as the fracture of the chip occurs. Therefore, by adding much amounts of In and Sn to improve the deformability and by dispersing the soft, pure Al particles of a high melting-point to soften the whole of the solder, it becomes possible to reduce the stress applied to the joints formed by the solder, so that the thermal fatigue properties can be improved. In order to disperse the Al particles in the solder, the aluminum and the Zn—Al—Mg—Ge alloy all prepared in the form of particles are mixed and dispersed to thereby prepare a powdered mixture. The mixture is then compacted and sintered under a static pressure in an inactive atmosphere or in a reducing atmosphere and are further rolled to thereby form a foil. By compacting the Zn—Al—Mg—Ge particles and Al particles at a high temperature under a static pressure after these particles are mixed at a room temperature in an inactive atmosphere, a resulting structure is such that the Al particles become so-called "islands" and the Zn—Al—Mg—Ge particles having a low melting point becomes so-called "sea", that is, the Al particles come to be uniformly dispersed discretely and the space among the Al particles comes to be filled with the Zn—Al—Mg—Ge alloy phase which acts to connect the discrete Al particles to each other. In this case, it is necessary that the Zn—Al—Mg—Ge particles related to bonding be the "sea." By providing such a state as the soft Al is uniformly dispersed in the solder, it becomes possible to relieve thermal impacts and to reduce the applied stress, whereby the thermal fatigue resisting property can be improved. Further, in order to strengthen the bonding between each of the Al particles and the Zn—Al—Mg—Ge alloy solder, the surface of the Al particles may be plated with a thin coating of Ni/Au plating (, in which the Ni and Au layers are made to have such a thin thickness as to be 0.1 to 0.5 μm and 0.1 μm, respectively, and in this case the Ni may be diffused in the solder, that is, a thick layer of Ni deteriorates the deformability of the Al,) or with a thin coating of Ag plating etc.

Further, in order to soften the solder, fine plastic particles plated with Au may be dispersed in the solder. Also, by dispersing and mixing low-thermal-expansion particles which are metallized with a metal wettable through the solder or which are plated with an Sn alloy solder on the metallization layer, it is possible to relieve the stress and to thereby improve the thermal fatigue resisting property of the joints formed by the solder.

In order to remove the voids (Paragraph 5) from the foil, it is effective to perform the sintering in a vacuum. However, even in a case of performing no vacuum treatment, it is possible to suppress the voids to a degree of not more than 3%.

As regards the preventing of the oxidation (Paragraph 6), it is realized by performing in a $N_2$ gas atmosphere the die-bonding insofar as the Zn—Al-MG-Ge alloy solder is concerned.

Further, regarding the corrosion resistance (Paragraph 7), the solder of the invention can clear high-temperature high-humidity test conditions (85° C., 85% RH, 1000 h) insofar as the Zn—Al-MG-Ge alloy solder is concerned.

Other objects, features and advantages of the invention will become apparent from the following description of the embodiments of the invention taken in conjunction with the accompanying drawings.

DESCRIPTION OF THE PREFERRED EMBODIMENTS

Embodiments of the invention are described below.
Embodiment 1:

A rolled foil fabricated by mixing Zn-4Al-3Mg-4Ge particles and Al particles is described below.

Figure 1A:
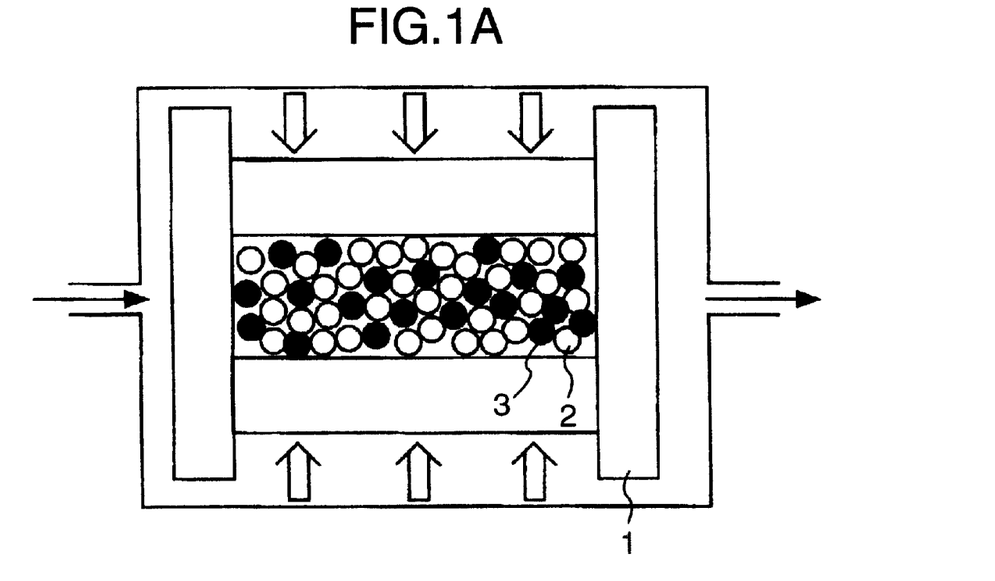
FIGS. 1A to 1C are drawings showing the steps of producing a composite metal made of a plurality of kinds of particles.
Figure 1B:
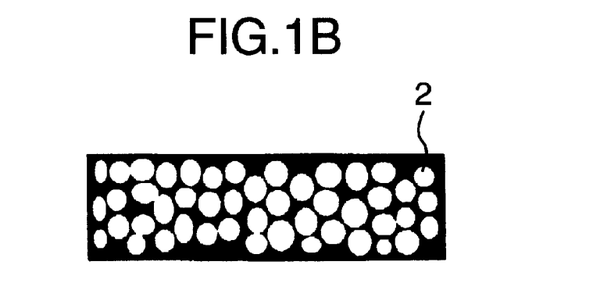
Figure 1C:
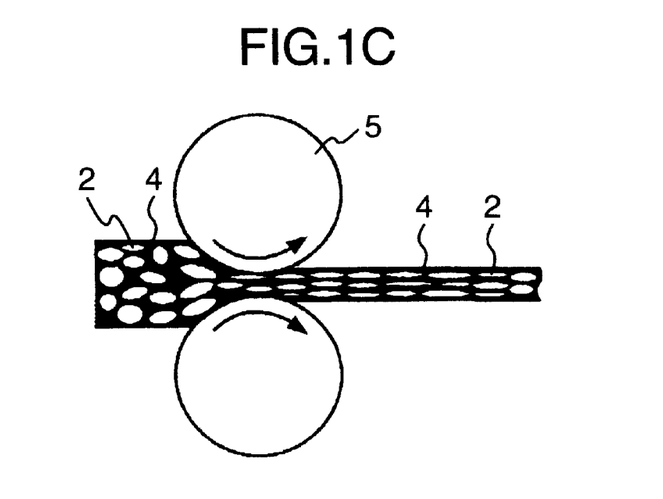

First, the rolling-ability of a compact made of the particles was examined by adding In to a Zn-4Al alloy, but it could not be rolled. It was found that the rolling of a Mg-added Zn-4Al alloy compact was impossible either. However, it was found that, by adding Ge therein, the rolling came to be possible to a certain degree. Thus, as a representative chemical composition which makes it possible to perform the rolling, the applying of a Zn-4Al-3Mg-4Ge alloy was examined. As a solder material intended for use in power modules etc. which are required to provide a high reliability at a high temperature not less than 260° C., an investigation was made on a rolled foil fabricated by mixing Zn-4Al-3Mg-4Ge particles and Al particles. FIG. 1A to FIG. 1C show schematic fabrication steps of a composite metal made of Zn-4Al-3Mg-4Ge alloy particles (melting point: 342–375° C., hardness: Hv 106) and pure Al particles (99.9%, hardness: Hv 17). FIG. 1A shows the state of the Al particles 2 and the Zn-4Al-3Mg-4Ge particles 3 contained in a carbon jig 1 of a vacuum hot press. FIG. 1B shows a cross-sectional model of the composite metal block obtained after the plastic flow of the solder portion which plastic flow occurs after a vacuum hot pressing, in which block the Zn-4Al-3Mg-4Ge particles are deformed to the "sea" 4 of the Zn-4Al-3Mg-4Ge alloy phase. FIG. 1C shows a model in which the composite ball block is further rolled by rolls 5 to thereby fabricate a solder foil. Incidentally, Zn-6Al-5Ge and Zn-20Al-3.5Ge alloys containing no Mg can be also rolled. Because the rolling-ability of the composite block of this composition is better than that of the composite block in the case where the composition contains a much amount of Al.

Zn-4Al-3Mg-4Ge particles each having a size of 10 to 20 $\mu$m and Al particles of about 10 $\mu$m in size were mixed so that the Zn-4Al-3Mg-4Ge particles had a ratio of about 60 vol. %. As regards the Al particles, it is possible to raise the packing ratio of the Al particles by further adding Al particle made to have smaller size so that the close-packed filling was able to be obtained. In a case where the Al particles have a large size, there occur unfavorable irregularities on the fillet surfaces of a joint, and hence it is preferred that the Al particles have a size of about 5 $\mu$m. Incidentally, in the case of the closest packing, a theoretical volume ratio of Al becomes about 74% and that of the solder becomes 26%. These particles were mixed in an Ar gas atmosphere and put in a compacting container (3 tons/cm$^2$) of a carbon jig. After evacuating the container, a pressure was gradually applied onto these particles from the outside thereof in an Ar gas atmosphere at a temperature not less than 200° C., whereby the plastic deformation of the Zn-4Al-3Mg-4Ge particles occurred to fill the gaps among the Al particles. The composite solder block made by use of this hot press was intended for use in the fabrication of the solder foil with a thickness of 150 $\mu$m, and in view of this it is preferred that the composite solder block be previously formed to have a thin shape close to the thickness of the foil so that a rolling operation can be readily performed because of a decreased rolling reduction needed to produce the foil.

In a case where the Al particles are exposed on the foil thus made, it is possible to prevent the exposed portions from being oxidized, by plating the surface of the Al particles or plating the foil surface with Ni/Sn coatings.

Figure 2A:
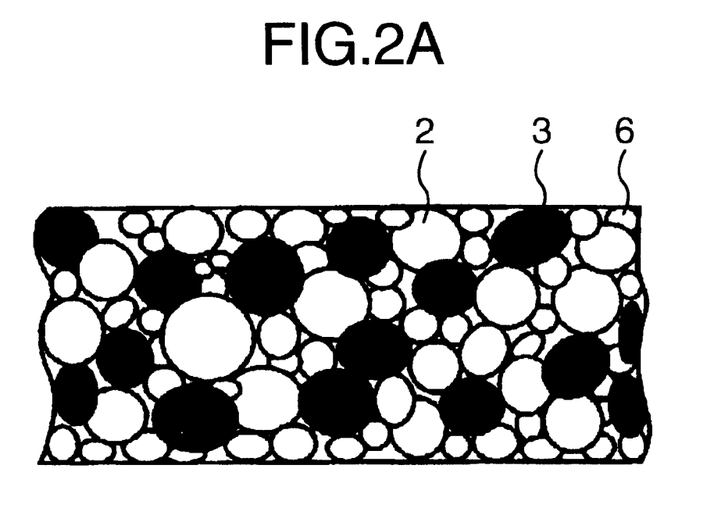
FIGS. 2A and 2B are drawings each showing a cross-sectional model of plastic particles each having elasticity, which drawings show the states before and after the rolling.
Figure 2B:
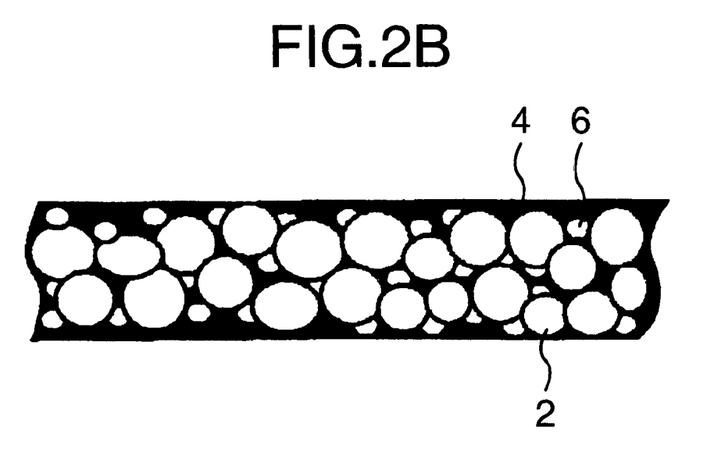

Embodiment 2:

FIGS. 2A and 2B show a composite before and after the rolling thereof, in which composite, besides Al particles 2 and Zn-4Al-3Mg-4Ge particles 3, plastic particles (rubber) 6 each having a soft, elastic body metallized (by electroless Ni plating-Au plating, or Au plating, or electroless Ni plating-solder plating) are dispersed in order to further lower the Young's modulus thereof. In this case, it is preferred that the plating coating provided on the plastic particles be such a soft one as that of Au, or Ag, or Al etc. which is capable of mitigating stresses caused by a deformation. According to this structure, even if the plating coatings are broken at a high temperature, the function of the rubber can be maintained insofar as the plastic particles are present in the solder. The size of the resin particles is not more than 10 $\mu$m and preferably in the range of not more than 1 $\mu$m. As regards the amount of the plastic particles, even a few volume percents thereof is effective.

In the case of the Zn-4Al-3Mg-4Ge alloy, which is wettable regarding Al in a reducing or inactive atmosphere, it is not necessary to perform the metallization on the surface of the Al particles. However, performing Ni/Au plating, or Ni/Sn plating etc. is effective to further raise the bonding strength therebetween. Further, the surface of the Al particles may be coated with a thin coating of Au, or Ag etc. by sputtering etc. Since the Zn-4Al-3Mg-4Ge alloy is hard in hardness at a low temperatures, it is preferred that each of the Al particles be spherical in shape to minimize an energy loss occurring by contact friction etc. and to increase a damping property against impact and oscillation. The particles of the alloy and the Al particles can be mass-produced at a low cost through a conventional atomizing process. As a substitute for the Al particles, it is also possible to use Cu, Ag or Au particles which have a high melting point and are relatively soft in hardness.

Embodiment 3:

As compositions obtained from Zn—Al-based alloy solders which is capable of being rolling-worked, there are a Zn—Al—Mg—Ga alloy (, for example, a Zn-4Al-3Mg-3Ga alloy), a Zn—Al—Ge alloy (, for example, a Zn-6Al-5Ge alloy and a Zn-20Al-3Ge alloy), a Zn—Al—Ge—Ga alloy (, for example, a Zn-6Al-5Ge-3Ga alloy), a Zn—Al—Mg—Ge alloy (, for example, a Zn-4Al-3Mg-4Ge alloy), a Zn—Al—Mg—Ge—Ga alloy (, for example, a Zn-4Al-1Mg-2Ge-3Ga alloy) and ones in which at least one kind selected from the group consisting of Sn, In, Ag, Cu, Au, Ni, Pd and etc. is added to the former compositions. It is pointed out that, since the Zn—Al alloy is apt to be oxidized and is high in rigidity, there is such a fear as cracking occurs in a Si-chip when the Si-chip is bonded through the solder of the Zn—Al alloy (Shimizu et al.: "Zn—Al—Mg—Ga Alloys for Pb-Free Solders for Die Attaching", Mate. Vol. 99, 1992–2).

In this embodiment, in order to address these problems and to decrease the rigidity of the solder, heat-resistant plastic particles plated with an Ni—Sn alloy or Au were uniformly dispersed in the Zn—Al alloy particles, whereby the Young's modulus of the solder was lowered. Regarding the Zn—Al alloy particles, when the rolling-ability and grain-boundary corrosion are taken into consideration, available solder particles are limited to the Zn—Al—Mg—Ge alloy and the Zn—Al—Mg—Ge—Ga alloy, both of which contain Mg and Ge. It is preferred that these plastic particles be fine in size in comparison with the size of the Zn—Al alloy particles and be dispersed substantially uniformly. Because the plastic particles of 1 $\mu$m level in size which are soft in hardness and which have elasticity are present at the time of the deformation, it becomes possible to obtain a remarkable relaxation against the thermal impact and against mechanical impact. That is, the rubber dispersed in the Zn—Al alloy solder particles acts to reduce the Young's modulus. Because the plastic particles are substantially uniformly dispersed among the Zn—Al alloy solder particles, this dispersion is not varied so much insofar as the melting thereof for a short period of time is concerned.

These particles are mixed and put beforehand in a container having such a shape as to be readily rolling-worked to a foil, and they are compacted in a vacuum by hot-pressing. During the compacting, the particles are uniformly compressed at a temperature at which no melting of the plating coating of Sn provided on the plastic particles occurs (melting point of Sn: 232° C.), whereby the plastic flow of the solder alloy particles occurs. Because the Zn—Al alloy particles is soft in hardness at a level of 220° C., that is, 8 Hv in hardness, the particles are easily deformed. A block in which the particles are substantially uniformly dispersed by the uniform compression is rolled to a thickness of about 150

μm to thereby fabricate a composite solder foil. When the foil is used in die bonding, it can be continuously supplied by use of a roll on which the foil is wound.

Since the Zn—Al alloy solders are apt to be oxidized, it is preferred, in taking the storage thereof into consideration, that the surface thereof be plated with Sn. This Sn is dissolved in the Zn—Al alloy solders at the time of the die bonding. The presence of Sn on the surface of the solder facilitates, for example, the bonding to an Ni—Au plating coating provided on a Cu stem. A Si-chip can also be easily bonded to, for example, a Cr—Ni—Ag metallized surface.

In this case, in addition to the plastic particles, Sn particles or In particles may be further mixed in an amount of 10 to 30 vol. % so that the Sn or In particles are present among the Zn—Al alloy solder particles, with the result that a part of the Sn or In particles is dissolved in the Zn—Al alloy particles together, other portions coming to exist in the state of Sn or In phase, which is not precipitated nor dissolved, and in the state of a soft Sn—Zn or In—Zn phase of a low melting point. The deformation for relaxing the stress is brought about by the rubber of the plastic particles and the Sn, In, Sn—Zn or In—Zn phase. Also, after the die bonding, a deformation is absorbed partly by the presence of the Sn or In phase. In addition, the rigidity of the solder is further decreased by the synergistic effect brought about from both of the plastic particles and the Sn or In phase. Also, in this case, the solidus line temperatures of the Zn—Al alloy solders is kept to be not less than 280° C. and, so that there is no problem regarding the strength at the high temperatures. However, this composition is intended for use in a hierarchical bonding performed at a relatively low temperature, so that the Sn, In, Sn—Zn or In—Zn phases is re-melted during the reflow.

Figure 3:
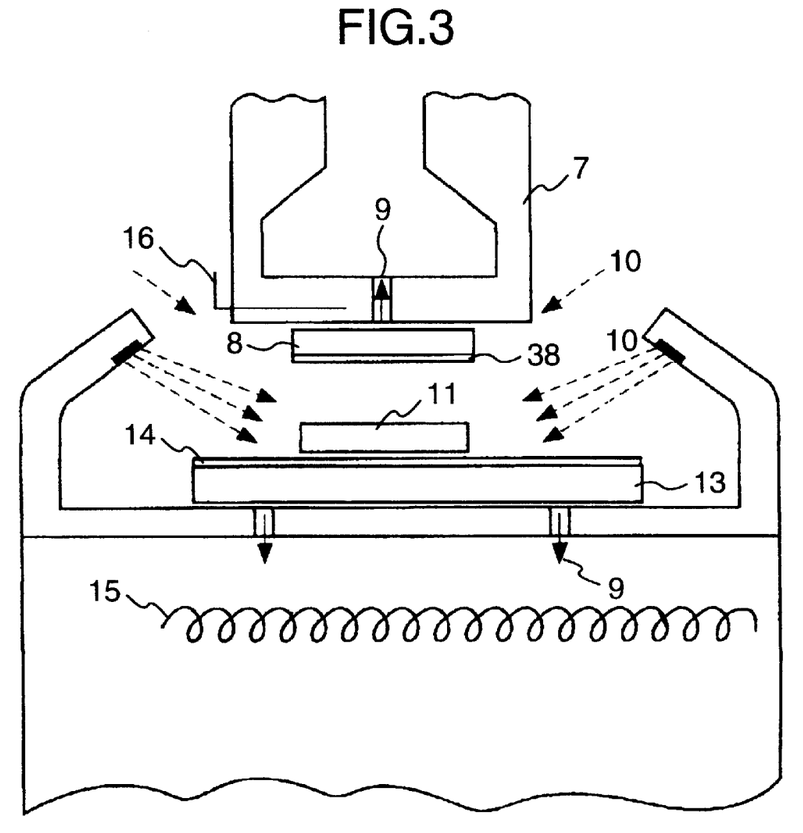
FIG. 3 is a drawing showing a cross-sectional model of an example of a die-bonding process.

Embodiment 4:

FIG. 3 shows an example of a die bonding process in which a solder foil 11 is used. For example, the process had the steps of: preparing a foil which was fabricated by mixing Zn-4Al-2Mg-3Ge-1Ag-10Sn particles, Al particles, a small amount of Sn particles, and solder-plated plastic particles; plating the foil with Sn (0.5 μm); placing the foil on a Cu stem 13 coated with Ni (3 μm)-Au (0.1 μm) layers; vacuum-sucking a Si chip 8 coated with a layer 38 of a Cr—Ni—Ag alloy which chip has a square shape with one side of 5 mm so that the Si chip is held on an electric resistance heating tool 7 of pulse-current; bringing the chip 8 into pressure-contact(initial pressure: 2 kgf) with the foil 11 having a square shape with one side of 4 mm and a thickness of 0.15 mm; and keeping them at a temperature of 400° C. at maximum for 10 seconds. A thermocouple 16 for measuring the temperature was embedded near a portion at which the tip of the tool comes to contact with the chip. In this process, since the solder foil is instantaneously melted when the temperature thereof reaches to the melting point, there was provided means for keeping the heating tool at a level spaced downward by 20 μm from the position where the pressure-contact is commenced between the foil and the tool, so that the molten solder is prevented from being crushed flat during the heating. The preheating of the stem on the substrate side was performed at about 200° C., and in order to prevent the oxidation of the solder foil, nitrogen gas 10 was locally jetted from the surrounding onto the solder foil. Further, nitrogen gas 10 was also fed to the surrounding of the tool adsorbing the Si chip 8 so that an oxygen concentration of 50 to 100 ppm level may be always maintained around the joint. The tool 7 adsorbing the Si chip in FIG. 3 has such a structure as to adsorb the surface of the chip, however, the tool is usually made to have such a structure as to apply a pressure onto the end portion of the chip so as to minimize a damage applied to the surface of the element. Alternatively, by use of this foil, it is possible to perform the reflow bonding of a power module etc. in a hydrogen gas furnace or in an inactive atmosphere furnace at a temperature of about 380° C. at maximum.

Figure 4:
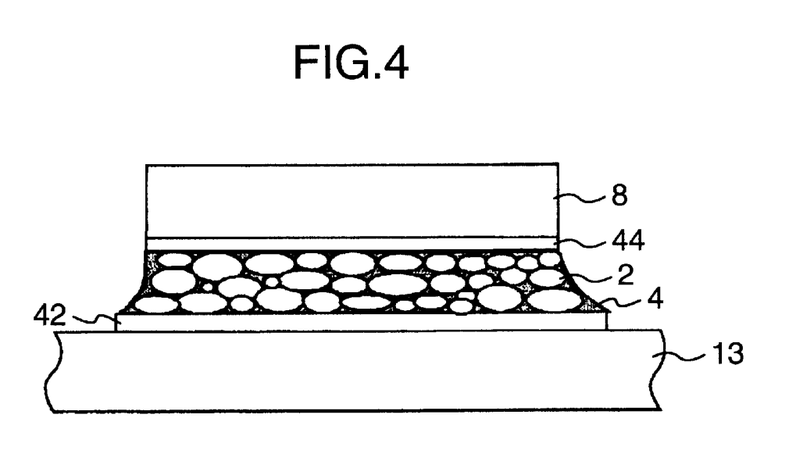
FIG. 4 is a cross-sectional view showing a model of die-bonded semiconductor device.

FIG. 4 shows a cross section of the Si chip bonded to the Cu stem. As a metallization coating 42 on the Cu stem 13, there is used Ni—Ag, or Ag besides the Ni—Au. As another metallization coating provided on the Si chip, it is possible to use Cr—Ni—Au, Ni—Au, Ni—Ag, or Ni—Sn etc.

In the case where the Zn—Al—Mg—Ge alloy solder is plated with Sn or In, the Sn or In comes to be readily wetted and spread by raising the temperature to a level not less than the liquidus line temperatures of the Zn—Al—Mg—Ge alloy solder, so that Sn or In is dissolved in the Zn—Al—Mg—Ge alloy solder. If the amount of Sn or In is excessive, all of Sn or In cannot be dissolved in the Zn-AL-Mg—Ge alloy and comes to be precipitated as a low-melting point Sn—Zn phase or In—Zn phase at grain boundaries. Thus, by intentionally making much Sn or In phases dispersed and precipitated, it is possible for the Sn—Zn or In—Zn phase to bear the deformation and for the Zn—Al alloy phase to bear the bonding strength. Accordingly, by plating the Zn—Al—Mg—Ge alloy particles with Sn or In and by intentionally making the Sn or In phases remain which cannot exist in a solid solution state in the Zn-AL-Mg—Ge particles, the deformation can be made to be absorbed by the Sn or In phase, whereby it is possible to lessen the rigidity of the solder. In order to further relieve the rigidity of the composite solder, plastic particles each having a size of about 1 μm each of which particles is coated with the alloy solder may be contained in the composite solder, so that the impact-resistance of the composite solder and the Young's modulus thereof can be improved. Thus, the thermal fatigue resisting property of joints formed of this solder is improved. Instead of adding a much amount of Sn in the solder beforehand, Sn or In may be added by plating each of the Zn-AL-Mg—Ge alloy particles with Sn or In or by adding and dispersing Sn or In particles of an appropriate amount, so that these particles containing Sn or In or the Sn or In particles may plastically flow among the Zn—Al—Mg—Ge alloy solder particles in a vacuum. Since the simple substance phase of Sn and In is softer in hardness than the low-melting point phase of the Zn—Sn or Zn—In alloy, the latter case is preferred in the view point of coping with a deformation.

The composite foil fabricated in the process according to the embodiment can be continuously supplied by use of a reel on which the foil is wound, the cutting thereof step being also performed continuously. Regarding the sealing portion and terminal joint of a part in which a temperature-hiererchical bonding is required, it is possible to perform the bonding of flux-less type by the steps of preparing, by punching etc., a solder foil having a shape corresponding to a solder joint to be formed, locating and fixing the punched foil on a substrate or on a part, applying and heating the foil in a nitrogen gas atmosphere by use of a pulse type pressurizing-and-heating tool. In this case, in order to ensure the prevention of the oxidation during the preheating and to keep the wettability, it is preferred to use a foil plated with Sn.

Figure 5A:
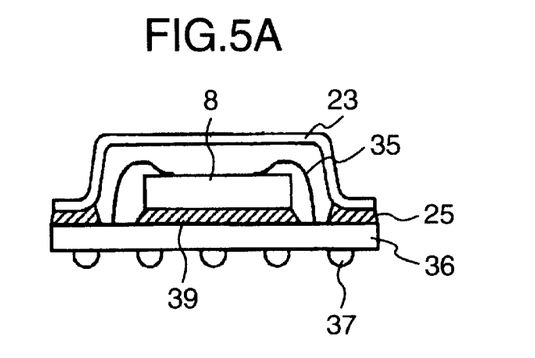
FIGS. 5A to 5C are drawings showing cross-sectional modes of a foil used to perform the bonding of a LSI and a cap to a substrate.
Figure 5B:
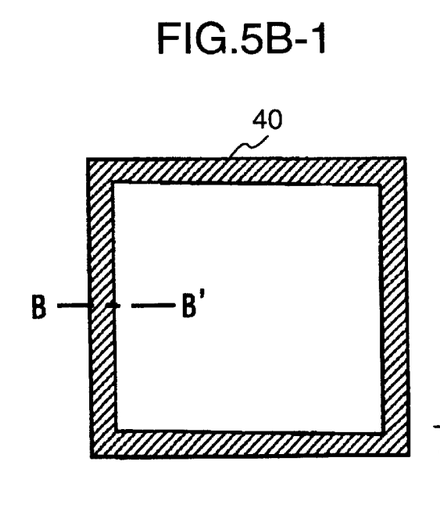
Figure 5B:
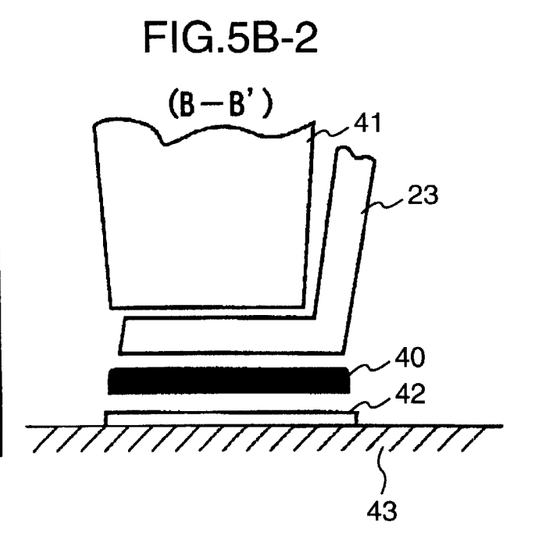

Embodiment 5:

FIG. 5A shows a cross section of a ceramic BGA or CSP produced by the steps of; locating a foil according to each of Embodiments 1 to 3 on an interchange substrate 36; applying a pressure to a chip 8 after sucking it by use of a tip tool having an electric resistance heating body for pulse-heating; performing the die-bonding shown by the reference numeral 39; connecting terminals on the chip and terminals on the interchange substrate 36 to each other by wire-bonding through Au wires 35; locating another foil according to each of Embodiments 1 to 3 between a fin 23 of Ni—Au plated Al etc. and the interchange substrate; and performing the sealing 25 of a fluxless type in a nitrogen gas atmosphere by use of the resistance heating body to thereby obtain the ceramic BGA or CSP. The process can also be applied to the mounting of a module in which resistors and capacitors are mounted on a chip. In particular, in the case of a high-output chip, since a joint is formed of a composite solder superior in thermal conduction which contains aluminum, it is possible to provide a good heat dissipation toward the interchange substrate superior in thermal conduction. Thus, regarding the mounting of small chip parts provided in a module, it is possible to use any one of a mixed type high-melting-point solder pastes of Cu—Sn or Au—Sn alloys etc. and the Zn—Al alloy high-melting point solder pastes.

FIG. 5B-1 shows a punched piece of foil 40 which is similarly fabricated from a material containing the Zn—Al—Mg—Ge particles and the Al particles according to each of the Embodiments 1 to 3. FIG. 5B-2 shows a cross-section of a model of heating the foil 40 and the Al fin 23 by use of a heating-and-pressurizing body 41 of a pulse heating type in a nitrogen gas atmosphere. Alternatively, it is also possible to perform the flux-less reflow bonding in a furnace of a reducing atmosphere such as hydrogen gas. Further, it is also possible to perform main bonding in the hydrogen gas furnace after the tack soldering of the foil 40 at 400° C. for 5 seconds performed by means of the pressurizing-and-heating body 41.

Figure 5C:
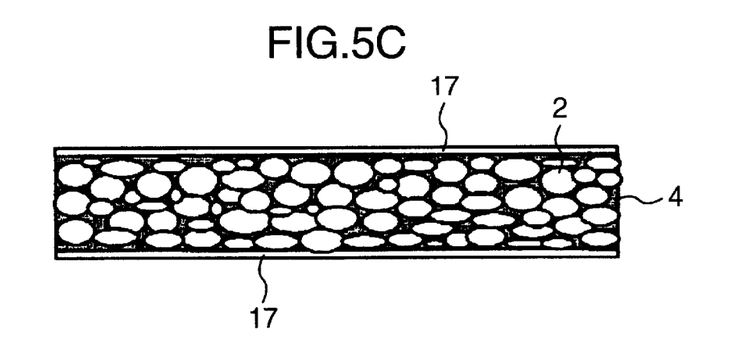

FIG. 5C shows a sectional model of the composite solder foil in which an Sn plating layer 17 encloses the periphery of the composite solder foil 11.

It is also possible to perform a reflow bonding in a hydrogen gas furnace, a reducing atmosphere furnace etc. by use of the composite foil according to each of Embodiments 1 to 3.

Figure 6A:
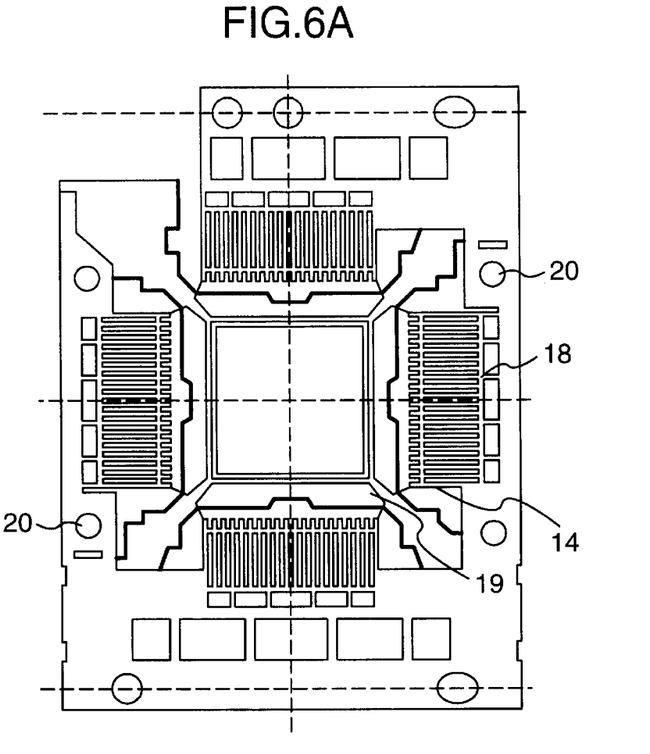
FIGS. 6A to 6C are drawings showing cross-sectional models of die-bonding joints provided by use of a composite solder foil.
Figure 6B:
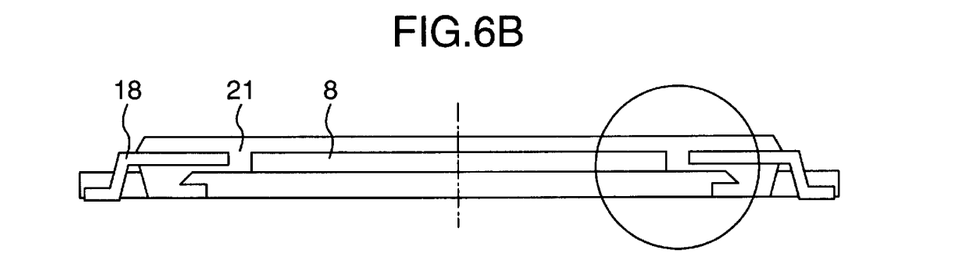
Figure 6C:
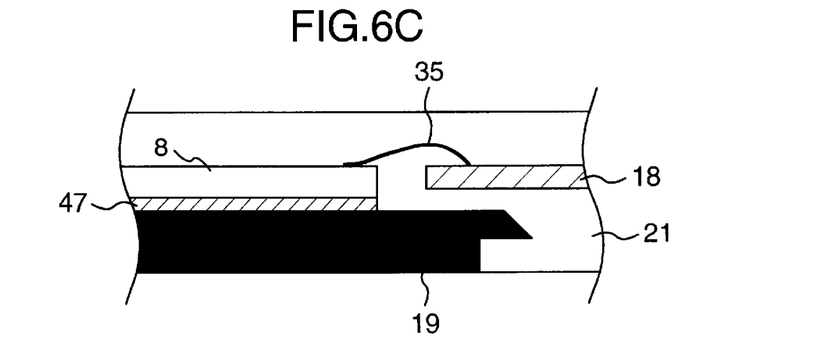

Embodiment 6:

Next, an application example in which the composite solder according to each of Embodiments 1 to 3 is used in a resin package of a high-output chip such as a motor driver IC. FIG. 6A is a plan view of a package in which a lead frame 18 and a thermal dissipation plate 19 are positioned, bonded and caulked to each other, in which there are two caulking portions 20. The interconnection terminals on the chip and leads 18 are wire-bonded 35 and resin molded 21. FIG. 6B is a cross-sectional view of the package and FIG. 6C is a partially enlarged view of a portion of the package. Heat occurring from a heat-generating chip 8 of about 3W level is conducted through a solder 47 to a thermal diffusion plate 19(made of a Cu-based low-expansion composite material) of a header. In particular, the solder that smoothly dissipates the heat generated in the high-output chip toward the thermal diffusion plate has a great role, and a remarkable improvement in the heat dissipation can be brought about from the composite solder according to the embodiments 1 to 3 containing the Al particles phase excellent in thermal conductivity and the Zn—Al alloy solder phase, in comparison with conventional Pb alloy solders.

Figure 7:
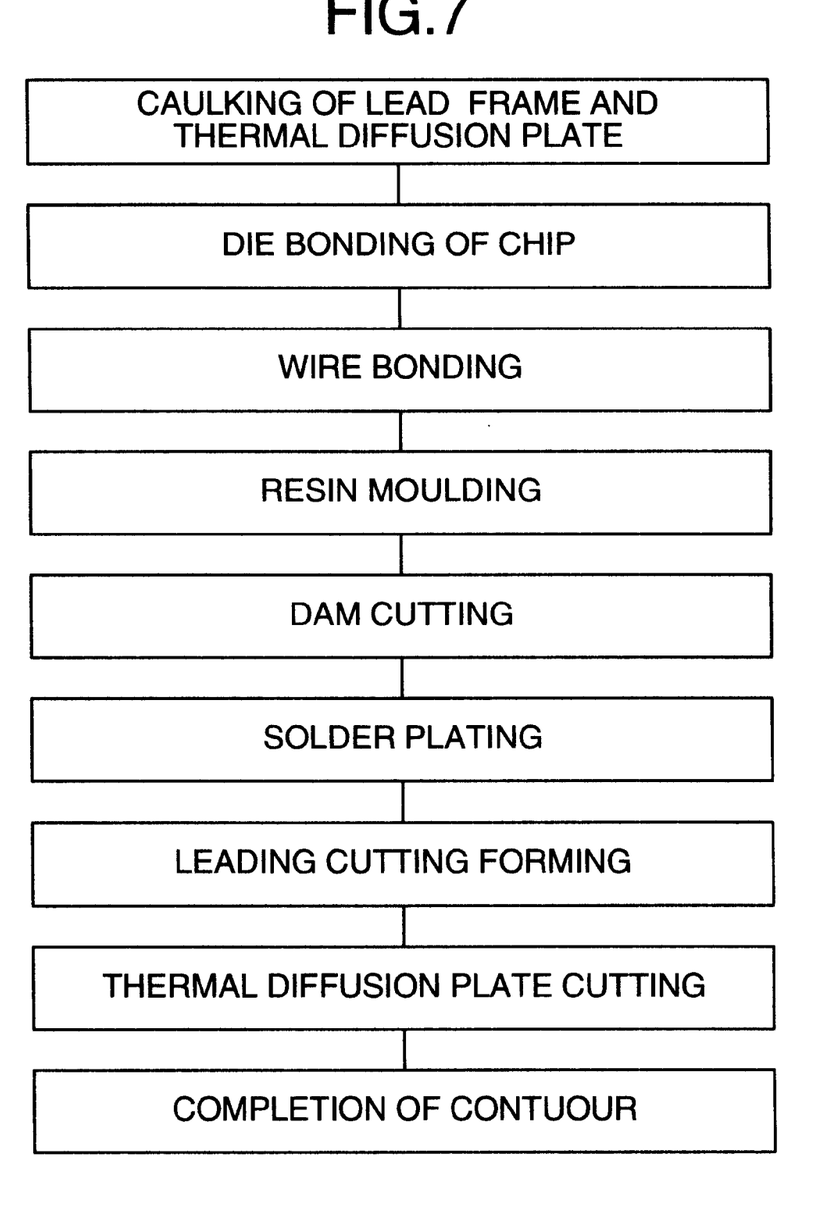
FIG. 7 is a drawing showing the steps of providing a package.

FIG. 7 shows the fabrication process of a package. The lead material was made of a 42 Alloy (, that is, 42 Ni—Fe alloy). After the dam cutting but before lead cutting thereof, a Sn alloy solder plating was applied to the lead material. The pads on the rear face of an Si chip 8 (FIG. 6C) were coated with a thin film of a Cr—Ni—Au, Cr—Ni—Ag, Ti—Ni—Ag or Ti—Ni—Au alloy etc. or with a Ni—Ag plating etc. The die bonding of the chip was performed by means of a pulse resistance heating body under an initial pressure of 2 kgf at 400° C. for 10 seconds while jetting a nitrogen gas thereto. For controlling a solder thickness of a joint to be formed, the heating body was set to stop at a position 20 μm spaced below from the initially pressure-applying position (, that is, a solder thickness of 150 μm) thereby to ensure a constant solder thickness, so that a constant thickness of the solder joint was obtained. In the case of the high-output chip, the reduction in the void ratio of the joint is important, and an intended void ratio not more than 5% was able to be achieved in this embodiment. Since the solder contains the Al particles, the solder will not move freely at the time of the bonding, so that voids are less apt to occur. Further, regarding the severe condition of temperature cycles, the joint formed of the solder displayed good characteristics because of the flexibility thereof brought about by the Al particles. Since the solidus line temperature of the solder is not less than 300° C., the solder ensures a high reliability even at a high temperature of about 260° C. After the die bonding and wire bonding 35, the chip was resin-molded 21 (FIG. 6C), and the dam cutting 14 (FIG. 6A)was performed. Then, an Sn—Bi alloy Pb-free solder was applied to the lead 18 so that a coating having a thickness of 2 to 8 μm was provided thereon. After that, the lead was cut and formed and unneeded potions in the thermal dissipation plate were cut, whereby the package was completed.

Figure 8:
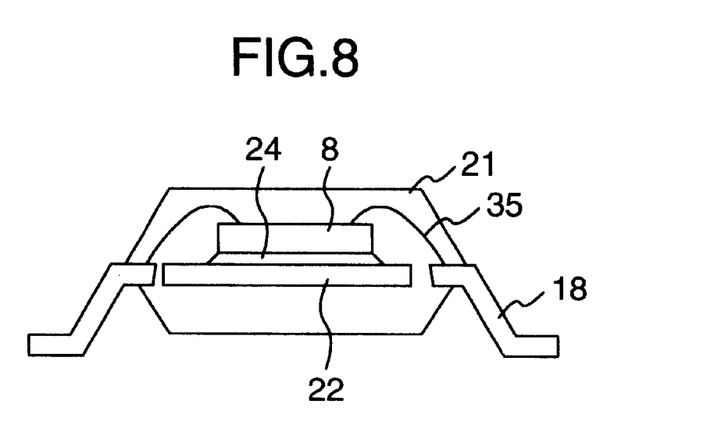
FIG. 8 is a cross-sectional view of an example of a plastic package.

FIG. 8 shows an example in which the composite solder according to each of Embodiments 1 to 3 is applied to a usual plastic package. The rear face of an Si chip 8 is bonded onto a tab 22 of 42 Alloy through an electrically conductive joint 24 made of this solder. The Si chip is bonded to a lead 18 by wire-bonding 35 and is then resin-molded 21. After that, a Sn—Bi alloy Pb-free solder was applied to the lead. In a conventional process, it was possible to use an Sn-37Pb eutectic solder with a melting point of 183° C. when mounting onto a printed circuit boards, and hence the reflow bonding of a chip was able to be performed at a temperature of 220° C. at maximum. In the case of the Pb-free solder, however, since the reflow bonding is need to be performed by use of a Sn-3Ag-0.5Cu alloy solder (melting point: 217 to 221° C.), the reflow bonding temperature becomes 240 to 250° C. at maximum, that is, the maximum temperature comes to increase by about 20° C. Thus, in a conventional technique, a heat-resistant electrically-conductive pastes have been used when bonding the Si chip 8 onto the tab 22 made of 42 Alloy. In this conventional case, however, the bonding strength is lowered at a high temperature, and the decomposed gas occurs due to the high temperature, so that the reliability thereof is deteriorated. Thus, by using the solder foil 11 (FIG. 3) related to the invention instead of using a conventional electrically-conductive pastes, it becomes possible to obtain a sufficient strength even at a high temperature of 260° C. The application of this solder foil to the plastic packages is effective in all package structures in each of which a Si chip and a tab are bonded to each other. Regarding the structure, these packages are sorted into a gull wing type, a flat type, a J-lead type, a butt-lead type, a lead-less type and etc.

Figure 9:
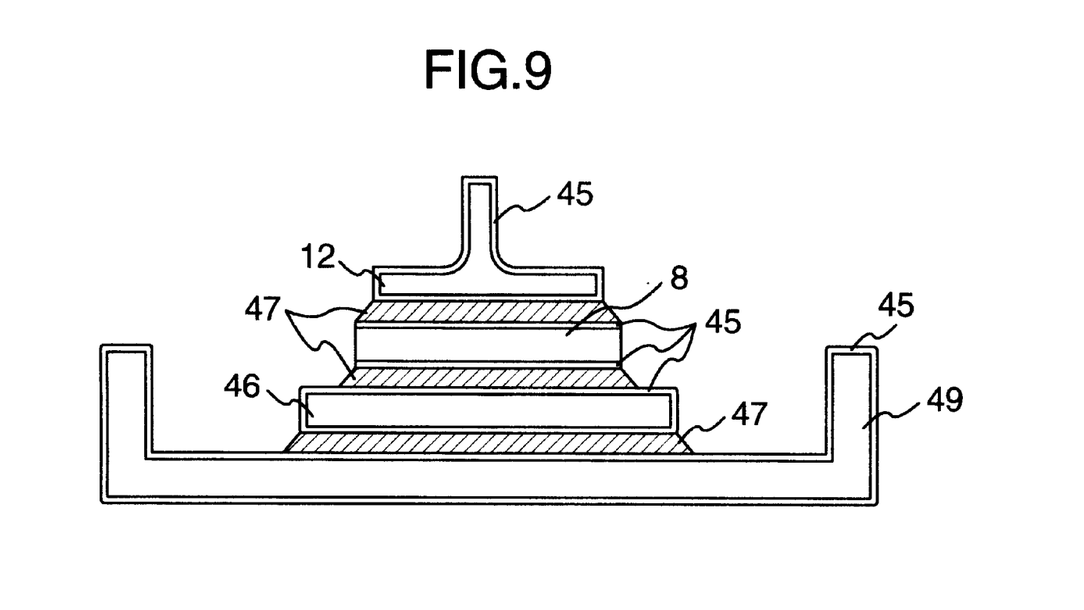
FIG. 9 is a cross-sectional view showing an example of a power module.

Embodiment 7:

FIG. 9 shows an example in which a solder foil relating to the invention was applied to the bonding of a power module. A diode Si chip 8 is often made to have a size of 6.5 mm. Thus, in prior arts, soft Pb-rich high-temperature solders have been used. In this example, therefore, the foil made of a mixture of Zn-6Al-5Ge alloy particles excellent in rolling-ability and Al particles was used. Namely, the Zn-6Al-5Ge alloy particles of 5 to 10 $\mu$m and the Al particles of 5 to 10 $\mu$m were mixed at a weight ratio of about 1:1, the mixture being subjected to a hot pressing operation in a vacuum or in a reducing atmosphere so that the Zn-6Al-5Ge alloy particles was made to plastically flow among the Al particles, and the composite material was rolling-worked to thereby produce a solder foil. This solder foil was cut to a predetermined size and was placed between the Si chip 8 and a low-thermal-expansion substrate 46 made of a Ni-plated Mo plate or made of a composite of both of invar and Cu, the solder foil being also placed between the substrate 46 and a Ni-plated Cu plate 49, the solder foil being further placed between the Si chip 8 and a Cu electrode terminal 12 having a Ni-plating coating 45, and these components were reflow-bonded at a time in a hydrogen gas furnace at 400° C. It was confirmed that, by performing a temperature cycle test and a power cycle test regarding the power module thus formed, the joint provided in this embodiment had a service life equivalent to that of joints provided by use of conventional Pb-containing solders.

Further, by dispersing in the solder foil the rubber of plastic particles each plated with Sn, the Young's module of the joint can be lowered with the result that thermal impact resisting property of the joint can be further improved, making it possible to successfully perform the bonding of a larger size Si chip. Alternatively, it is possible to provide the joint by a pressurizing-and-heating process performed at 420° C. at maximum for 10 seconds by use of a die bonder of a pulse heating type while jetting a nitrogen gas. Also, it is possible to adopt another bonding method in which the tack soldering of the chip is first performed by the pulse heating method and then the reflow bonding is performed at a time in a hydrogen furnace.

Advantageous effects obtained from the features of the invention are briefly recited below.

Since Zn—Al—Ge alloy solders etc. capable of being rolling-worked are hard in hardness, it was difficult to use these solder for bonding large chips etc. Thus, by mixing the soft Al particles to thereby lower the apparent rigidity of the solder, it became possible in the invention to obtain a highly reliable electronic device, for example, a semiconductor device. Incidentally, the bonding by use of the solder relating to the invention is not limited to the mounting of the electronic device, but is applicable to the bonding or Us sealing etc. of a structural member because the solder has an excellent, low elasticity, whereby the reliability can be remarkably improved and the application thereof in various fields can be expected.

It will be further understood by those skilled in the art that the foregoing description has been made on the embodiments of the invention and that various changes and modifications may be made in the invention without departing from the spirit of the invention and the scope of the appended claims.

It should be further understood by those skilled in the art that the foregoing description has been made on embodiments of the invention and that various changes and modifications may be made in the invention without departing from the spirit of the invention and the scope of the appended claims.

What is claimed is:

1. An electronic device comprising at least one electronic part and a substrate on which said electronic part is mounted, said electronic part and said substrate being bonded by a solder joint comprising a phase of Al particles and another phase of a Zn—Al—Mg—Ge alloy, said Al particles being connected to each other by said another phase.

2. A semiconductor device comprising a semiconductor chip, electrode pads provided on said semiconductor chip, a substrate on which said semiconductor chip is mounted, a lead of said substrate which lead is electrically connected to said electrode pads through a gold wire, and a solder joint, said semiconductor chip and said substrate being bonded by said solder joint comprising a phase of Al particles and another phase of a Zn—Al—Mg—Ge alloy.

3. A semiconductor device comprising a semiconductor chip, electrode pads provided on said semiconductor chip, a substrate on which said semiconductor chip is mounted, a lead of said substrate which lead is electrically connected to said electrode pads through a gold wire, and a solder joint, said semiconductor chip and said substrate being bonded by said solder joint comprising a phase of Cu particles and another phase of a Zn—Al—Mg—Ge alloy.

4. A semiconductor device according to claim 2, wherein the surface of each of said Al particles is plated with at least one kind selected from the group consisting of Ni, Cu, Ag, Sn and Au.

5. A semiconductor device according to claim 3, wherein the surface of each of said Cu particles is plated with at least one kind selected from the group consisting of Ni, Cu, Ag, Sn and Au.

6. A semiconductor device according to claim 2, wherein said solder joints further have a third phase of particles of a plastic.

7. A semiconductor device according to claim 3, wherein said solder joints further have a third phase of particles of a plastic.

8. A semiconductor device according to claim 6, wherein said plastic particles are made of one kind selected from the group consisting of a polyimide, a heat-resistant epoxy, a silicone, various types of polymer beads, modified types of these, and a mixture of these.

9. A semiconductor device according to claim 6, wherein said plastic particles are made of one kind selected from the group consisting of a polyimide, a heat-resistant epoxy, a silicone, various types of polymer beads, modified types of these, and a mixture of these.

10. A semiconductor device according to claim 2, wherein said solder joint further includes in addition to the phase of said Al particles at least one phase selected from the group consisting of Sn particles and In particles.

11. A semiconductor device according to claim 3, wherein said solder joint further includes in addition to the phase of said Cu particles at least one phase selected from the group consisting of Sn particles and In particles.

12. A semiconductor device according to claim 2, wherein said solder joint includes in addition to said phase of said Al particles at least one phase selected from the group consisting of invar particles, silica particles, alumina particles, AlN particles and SiC particles.

13. A semiconductor device according to claim 3, wherein said solder joint includes in addition to said phase of said Cu particles at least one phase selected from the group consisting of invar particles, silica particles, alumina particles, AlN particles and SiC particles.

14. A semiconductor device according to claim 2, wherein said Zn—Al—Mg—Ge alloy consists, by mass, of 3 to 7% Al, 0.5 to 6% Mg, 1 to 5% Ge, and the balance Zn and incidental impurities.

15. A semiconductor device according to claim 3, wherein said Zn—Al—Mg—Ge alloy consists, by mass, of 3 to 7%

Al, 0.5 to 6% Mg, 1 to 5% Ge, and the balance Zn and incidental impurities.

16. A semiconductor device according to claim 2, wherein said Zn—Al—Mg—Ge alloy includes a 4 mass % Al-3 mass % Mg-4 mass % Ge-the balance Zn alloy.

17. A semiconductor device according to claim 3, wherein said Zn—Al—Mg—Ge alloy includes a 4 mass % Al-3 mass % Mg-4 mass % Ge-the balance Zn alloy.

* * * * *